United States Patent [19]

Holycross et al.

[11] Patent Number: 4,648,699
[45] Date of Patent: Mar. 10, 1987

[54] POINT CONTACT DEVELOPMENT OF IMAGING SHEETS EMPLOYING PHOTOSENSITIVE MICROCAPSULES

[75] Inventors: Mark Holycross, Centerville; Edward J. Saccocio, Columbus; Scott Proehl, Miamisburg, all of Ohio

[73] Assignee: The Mead Corporation, Dayton, Ohio

[21] Appl. No.: 793,374

[22] Filed: Oct. 31, 1985

[51] Int. Cl.⁴ .............................................. G03D 5/02
[52] U.S. Cl. .................................. 354/297; 354/304; 346/135.1; 428/402.22; 355/27
[58] Field of Search ................. 430/138; 354/297, 301, 354/302, 303, 304, 319; 355/27, 28, 100; 428/402.2, 402.21, 402.22; 346/135.1, 111, 140 R, 29, 105

[56] References Cited

U.S. PATENT DOCUMENTS

| | | | |
|---|---|---|---|
| 2,374,862 | 5/1945 | Green | 346/135.1 |
| 3,149,902 | 9/1964 | Dransfield | 346/105 |
| 3,261,021 | 7/1966 | Kirchner | 346/105 |
| 3,306,747 | 2/1967 | Haas | 428/402.22 |
| 3,427,180 | 2/1969 | Phillips | 428/402.22 |
| 3,700,439 | 10/1972 | Phillips | 430/138 |
| 3,757,349 | 9/1973 | Fulton | 346/111 |
| 4,121,224 | 10/1978 | Takeuchi et al. | 346/140 R |
| 4,399,209 | 8/1983 | Sanders et al. | 430/138 |
| 4,400,704 | 8/1983 | Brown et al. | 346/29 |
| 4,448,516 | 5/1984 | Arney et al. | 355/27 |
| 4,578,340 | 3/1986 | Saccocio et al. | 354/297 |
| 4,592,986 | 6/1986 | Nelson et al. | 430/138 |

FOREIGN PATENT DOCUMENTS 59-54596 3/1984 Japan ................. 428/402.2

*Primary Examiner*—A. A. Mathews
*Attorney, Agent, or Firm*—Biebel, French & Nauman

[57] ABSTRACT

Imaging sheets having a coating containing chromogenic material and a photosensitive composition with at least the photosensitive composition encapsulated in rupturable microcapsules as an internal phase are processed by relatively moving the imaging sheets and at least one point contact which is resiliently biased into engagement with the imaging sheets such that the force of the point contact is applied to the imaging area of the imaging sheet.

8 Claims, 20 Drawing Figures

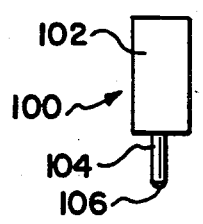 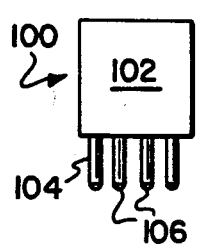 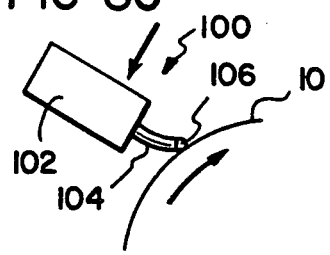
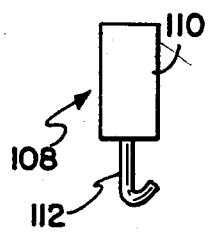 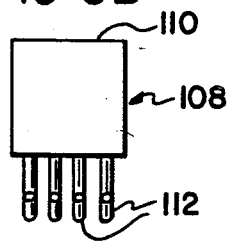 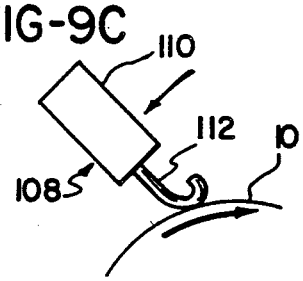
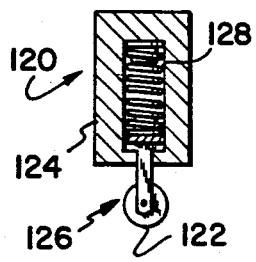 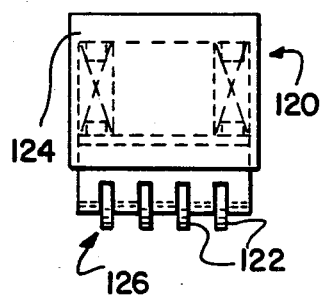 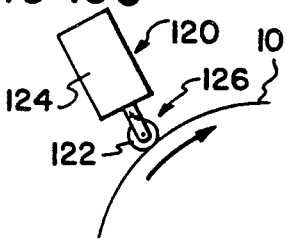

POINT CONTACT DEVELOPMENT OF IMAGING SHEETS EMPLOYING PHOTOSENSITIVE MICROCAPSULES

BACKGROUND OF THE INVENTION

The present invention relates generally to an imaging system utilizing imaging sheets having a surface coating of rupturable photosensitive microcapsules and, more particularly, to a method and apparatus for processing such imaging sheets by means of one or more point contacts.

U.S. Pat. Nos. 4,440,846 and 4,399,209, which are assigned to The Mead Corporation and hereby incorporated by reference, describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. The imaging system is particularly advantageous because it is a totally dry system and does not rely upon the application of wet development processing solutions to produce the image. An imageforming chromogenic material, such as a substantially colorless color former, is typically associated with the microcapsules. When the microcapsules rupture, the color former image-wise reacts with a developer material and produces a color image. In the embodiments described in the referenced patents, the microcapsules are typically ruptured by passing image-wise exposed imaging sheets through the nip between a pair of calender rollers.

While heavy pressure is not required to rupture the microcapsules, high pressure and large calender rollers are normally used to develop the imaging sheets. Even carefully machined metal calender rollers have uneven surfaces. If one roller is simply rested upon another, the surfaces of the rollers are not in contact over the entire length of the rollers. By applying pressure to the rollers, the uneven surfaces or surface irregularities are "smoothed out" to provide a uniform contact line between the rollers. The high pressure and large size of the rollers are necessary to achieve a uniform distribution of the rupturing forces across the surface of the imaging sheets. If the rupturing force is not uniformly distributed, the imaging sheets develop unevenly and the tonal characteristics of the resulting images are not good.

As the width of the imaging sheets and the corresponding length of the calender rollers increases, the diameter of the rollers must also be increased to maintain sufficient stiffness such that pressure applied to the ends of the rollers is distributed evenly along the entire expanse of the rollers. As a general rule, as the length of the rollers is doubled, the diameter of the rollers must be doubled in order to maintain sufficient stiffness. Thus, as the size of the imaging sheets increases, the cost and size of effective pressure-type development apparatus becomes prohibitive. In particular, while larger pressure rollers may be accommodated in developing apparatuses designed to develop relatively small copies, e.g., 8-12 inches in width, in certain applications, such as color proofing, large copy widths sometimes in excess of 36 inches are used. These copies are so large as to make it impractical to develop them using pressure rollers.

An additional drawback of processing imaging sheets by means of high pressure calender rollers is that some of the midtone quality of the developed images is lost. This is apparently due to a loss of a differential microcapsule rupture and is referred to as "midtone mottle". Thus, a number of difficulties have been encountered in designing calender rollers for pressure development of the aforementioned imaging sheets.

Alternate techniques for processing imaging sheets without bulky, high pressure calender rollers are known in the prior art. In commonly assigned U.S. Pat. No. 4,448,516, the imaging sheets are passed over a developer roll having a fibrous outer surface composed of interwoven natural or synthetic fibers or flexible bristles. The developer roll is rotated in contact with the imaging sheets to rupture the microcapsules on the sheets.

A second arrangement for generating shear forces for processing imaging sheets is disclosed in commonly assigned U.S. patent application Ser. No. 670,447, which was filed on Nov. 13, 1984, now U.S. Pat. No. 4,578,340, and entitled "Free Particle Abrasion Development of Imaging Sheets Employing Photosensitive Microcapsules," wherein imaging sheets are contacted with a bed of free particles such that the free particles pass over the microcapsules on the surface of the imaging sheets to rupture the microcapsules. A third arrangement is disclosed in U.S. patent application Ser. No. 711,779, filed Mar. 14, 1985, now U.S. Pat. No. 4,592,986, and entitled "Magnetic Brush Abrasion Development of Imaging Sheets Employing Photosensitive Microcapsules," wherein imaging sheets are processed by contacting the imaging sheets with a traveling pile formed by magnetically attractable free particles on a magnetic brush.

While these alternate processing arrangements each offer attractive features and may be preferred for selected applications, each also includes undesirable characteristics. For example, the fibrous outer surface of the developer roll of U.S. Pat. No. 4,448,516 has limited microcapsule engaging surface area. Accordingly, as imaging sheets are processed by the developer roll to rupture the microcapsules on the sheets, oil released from the ruptured microcapsules accumulates on the limited surface area of the developer roll. After a given amount of oil accumulation, background coloring (fog) begins to increase on processed imaging sheets. Since background coloring detracts from the developed image, the developer rolls must be frequently changed to maintain high quality images. In the free particle and magnetic brush arrangements for processing imaging sheets, a similar build up of oil requires periodic, though less frequent, servicing to clean or replace the particle beds.

New alternatives which offer more compact and less expensive techniques for developing imaging sheets, overcome deficiencies of the prior art and may be preferred for selected applications are in demand and serve to advance the art of imaging systems utilizing the imaging sheets of the referenced patents.

SUMMARY OF THE INVENTION

The term "microcapsule" as used herein refers to both microcapsules having a discrete microcapsule wall and microcapsules formed in a so-called open phase system wherein the internal phase constituents are simply dispersed in a binder.

The term "photosensitive composition" means a composition which changes viscosity in response to actinic radiation.

The term "chromogenic material" refers to the color forming reactant which is encapsulated or otherwise associated with the microcapsules.

The term "developer" refers to the reactant not associated with the microcapsules.

In accordance with the present invention, an imaging sheet is processed by relatively moving the imaging sheet and at least one point contact which is resiliently biased into engagement with the imaging sheet such that the force of the point contact is applied to the imaging area of the imaging sheet. In its broadest sense, the present invention relates to a method and apparatus for rupturing the microcapsules which form a photosensitive layer on the aforementioned imaging sheets by supporting an imaging sheet to be processed, positioning at least one point contact in resilient pressure engagement with the imaging sheet, and relatively moving the imaging sheet and the at least one point contact to apply a uniform rupturing force to the imaging sheet thereby rupturing the microcapsules.

A latent image in the imaging sheet is developed if the microcapsules are ruptured in the presence of a developer. A developer can be provided as a coating on the imaging sheet itself such that, as the microcapsules are ruptured, the developer and a chromogenic material, such as a colorless color former, interact and form the image. Alternately, the developer may be provided on a receiver sheet which is aligned and in facing engagement with the imaging sheet such that, as the microcapsules rupture and release their internal phase, the chromogenic material interacts with the developer to form the image on the receiver sheet.

In one embodiment of the present invention, a cylinder is mounted for rotation and an imaging sheet to be processed is secured to the cylinder. At least one point contact is positioned in resilient pressure engagement with the imaging sheet, and the cylinder is rotated while the at least one point contact is axially moved along the cylinder in synchronism with the rotation of the cylinder.

In another embodiment, an imaging sheet to be processed is secured to a substantially planar mounting platform. At least one point contact is positioned in resilient pressure engagement with the imaging sheet, and the point contact is moved over the portion of the mounting platform corresponding to the imaging sheet. Preferably, the point contact comprises a ball mounted for rotation in an appropriate receiving socket such that the point contact is made by the ball as it rotates within the socket and over the imaging sheet.

A web of imaging material may also be processed in accordance with yet another embodiment of the present invention by scrolling the web of imaging material past a processing station. At least one point contact is positioned adjacent to and in resilient engagement with the web at the processing station. The point contact is traversed over the web concurrently with the scrolling of the web to apply a uniform rupturing force to the web and thereby rupture the microcapsules as the web is scrolled past the processing station. The point contact may be traversed across the web, for example, by continuously sweeping the point contact around a substantially circular path.

It is, therefore, a primary object of the present invention to provide a method and apparatus for processing an imaging sheet by means of one or more point contacts through relative movement between the imaging sheet and the one or more point contacts in resilient pressure engagement with the imaging sheet such that the pressure of the one or more point contacts is applied to the imaging sheet to provide an effective uniform force to rupture the microcapsules and permit chromogenic material associated with the microcapsules to interact with a developer and thereby develop a latent image in the imaging sheet.

Other objects and advantages of the invention will be apparent from the following description, the accompanying drawings and the appended claims.

BRIEF DESCRIPTION OF THE DRAWINGS

FIGS. 7–10 are illustrative embodiments of point contacts which can be used in the present invention.

DETAILED DESCRIPTION OF THE INVENTION

Figure 1A:
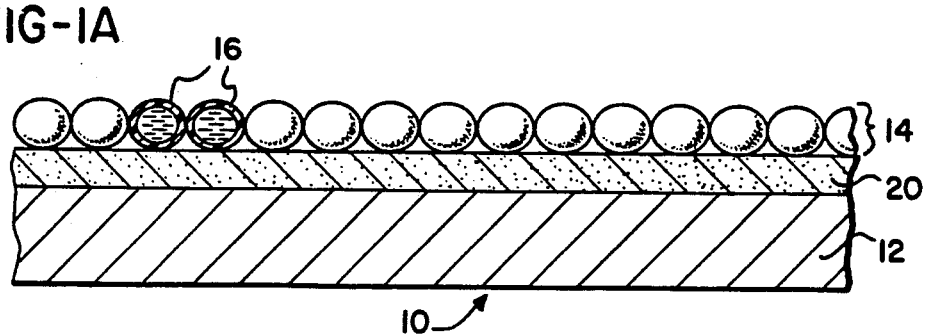
FIGS. 1A and 1B show a self-contained imaging sheet and formation of a latent image in the imaging sheet which is then processed in accordance with the present invention to form an image as shown in FIG. 1C.
Figure 2A:
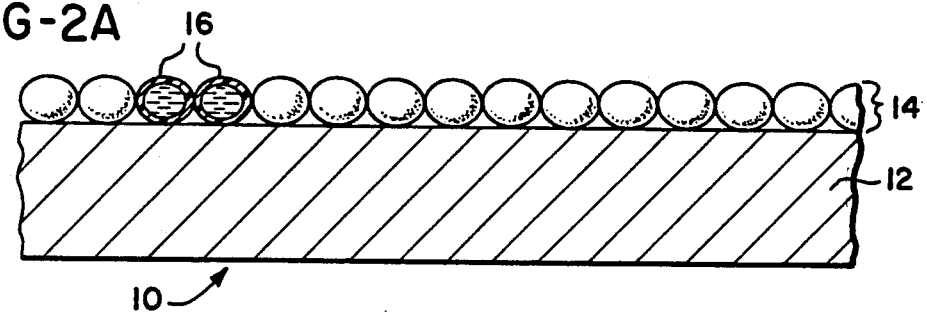
FIGS. 2A and 2B show a transfer imaging sheet and the formation of a latent image in the imaging sheet which is then processed in accordance with the present invention to form an image as shown in FIG. 2C.

FIGS. 1A and 2A illustrate embodiments of the imaging sheets in accordance with referenced U.S. Pat. Nos. 4,440,846 and 4,399,209, respectively. Therein, an imaging sheet 10 is constituted by a substrate 12 coated with a layer of microcapsules 14. The microcapsules 14 are filled with an internal phase 16 containing a photosensitive composition. Usually, the microcapsules 14 also contain chromogenic material; however, chromogenic material can be associated with the microcapsules 14 in other ways, such as by incorporation into the microcapsule wall or in a layer contiguous with the microcapsules.

In actuality, the microcapsules 14 are not visible to the unaided eye, since the mean size of the microcapsules generally ranges from approximately 1–25 microns. In the imaging sheet 10, shown in FIG. 1A, a layer of developer material 20 is interposed between the layer of microcapsules 14 and the substrate 12.

Figure 1B:
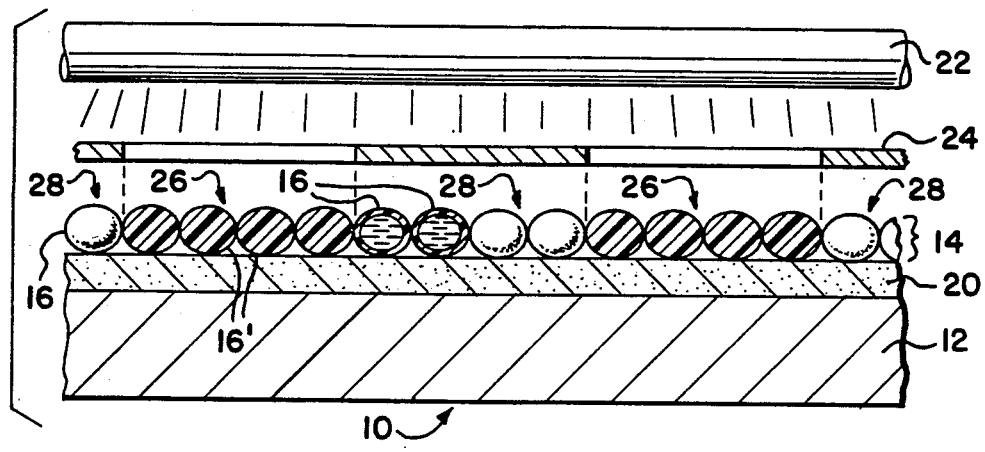
Figure 1C:
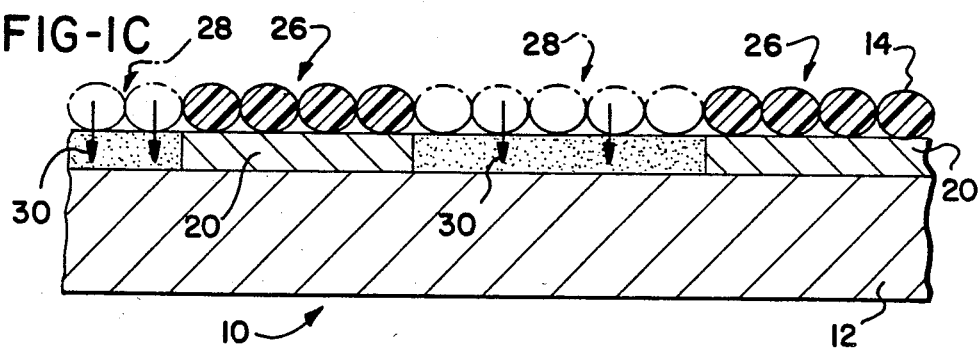
Figure 2B:
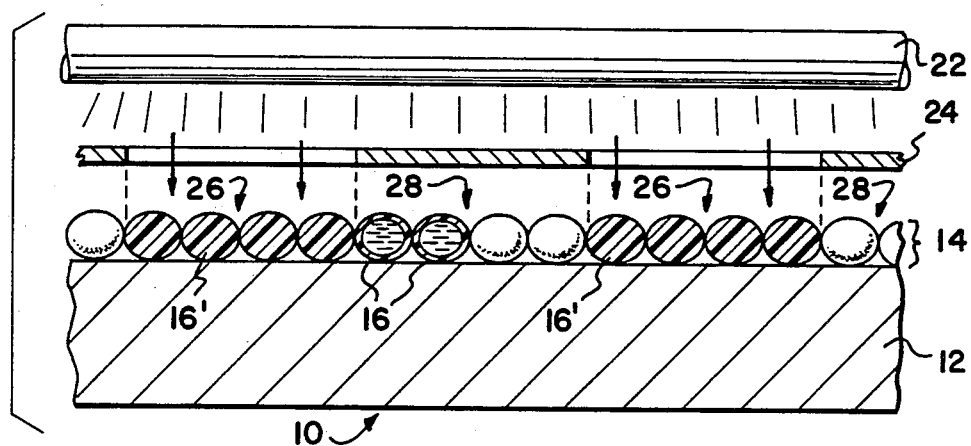

Exposure of the imaging sheets 10 by transmission imaging is shown in FIGS. 1B and 2B wherein a source of radiant energy 22 is positioned above the surface of the imaging sheets 10 with a mask 24 positioned therebetween. In the illustrations of FIGS. 1 and 2, the substrate 12 is opaque and the photosensitive material within the microcapsules 14 is a positive working radiation curable material, i.e., the viscosity of the material increases upon exposure to actinic radiation.

The radiation of the exposed areas 26 causes the radiation curable composition in the internal phase 16 of the microcapsules 14 to polymerize thereby gelling, solidifying or otherwise immobilizing the chromogenic material and preventing the chromogenic material from reacting with the developer material 20. To simplify the illustration, internal phase 16′ in the exposed areas 26 is shown as a solid; whereas, the internal phase 16 remains liquid in the unexposed areas 28.

The imaging sheets 10 are processed in accordance with the present invention by subjecting the imaging sheets to a uniform rupturing force by means of one or more point contacts in resilient pressure engagement with the imaging sheets. The imaging sheets and the one or more point contacts are moved relative to one another such that the point contacts apply a uniform force to substantially the entire imaging sheets to rupture the microcapsules 14 such that the chromogenic material contained within the microcapsules 14 or otherwise associated therewith can interact with the developer material 20. The uniform rupturing force is applied by the one or more point contacts to substantially the entire imaging sheets by moving the point contacts, the imaging sheets or both the point contacts and the imaging sheets.

Figure 2C:
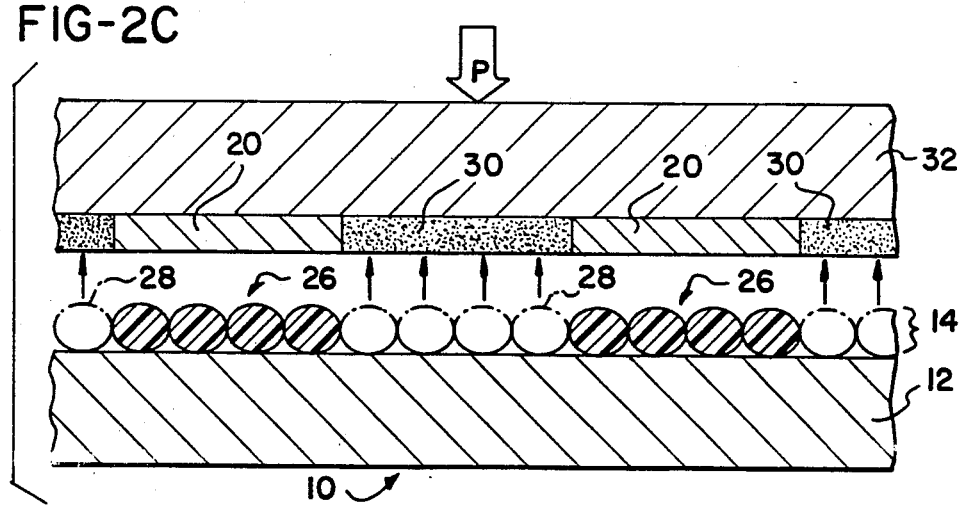

In the case of the self-contained imaging sheets, as shown in FIGS. 1A, 1B and 1C, the developer is on the same surface of the sheet 10 as the microcapsules 14, and upon rupturing the microcapsules 14, the internal phase migrates to the developer material 20 where it reacts with the developer material to form a visible image 30. In the case of the transfer imaging sheets, as shown in FIGS. 2A, 2B and 2C, the developer 20 is formed as a layer of developer material on a separate substrate or receiver sheet 32. As shown in FIG. 2C, the receiver sheet 32 is aligned and in facing engagement with the transfer imaging sheet 10. As the uniform rupturing force is applied by the one or more point contacts to the combination of the transfer imaging sheet 10 and the receiver sheet 32, the microcapsules 14 are ruptured and the internal phase migrates to the developer layer 20 of the receiver sheet 32 where it reacts with the developer material to form the image 30.

Figure 3:
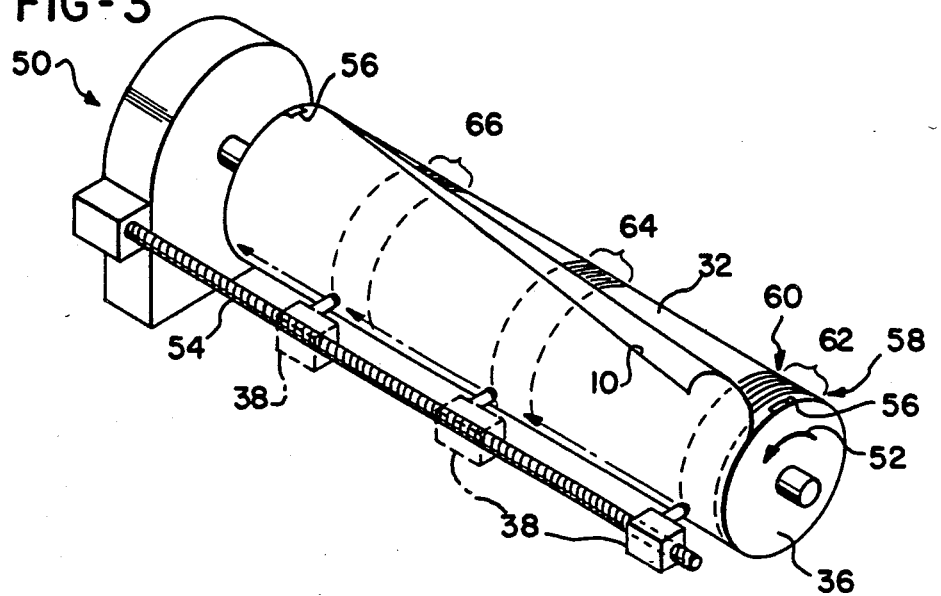
FIGS. 3–6 are schematic views of illustrative embodiments of apparatus for processing imaging sheets in accordance with the present invention.
Figure 7:
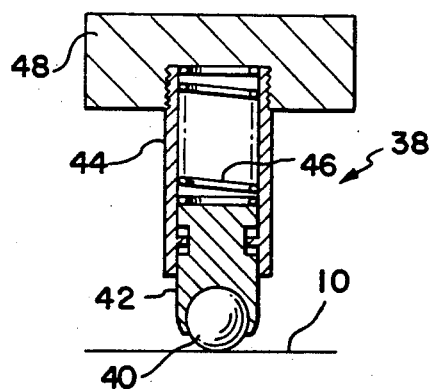

FIG. 3 is a schematic perspective view of a first illustrative embodiment of apparatus for processing imaging sheets in accordance with the present invention. In the embodiment of FIG. 3, support means for receiving a sheet of imaging material comprises a cylinder 36 mounted for rotation and point contact means comprises a rotating ball device 38 as best shown in FIG. 7. The rotating ball device 38 comprises a ball 40 mounted for rotation in an appropriate receiving socket 42 which is in turn slidingly received within a sleeve 44 such that the ball 40 in the receiving socket 42 may be resiliently biased into an imaging sheet 10, for example, by means of a spring 46. As illustrated in FIG. 7, the sleeve 44 may be threadingly engaged with a support block 48 to permit servicing of the rotating ball point contact device 38. It will be apparent to those skilled in the art that a large variety of arrangements are possible for mounting a rotating ball to form the point contact device 38 for use in the invention of the present application.

Returning to FIG. 3, motive means comprising an appropriate drive arrangement 50 produces relative movement between the cylinder 36 and the ball and socket point contact device 38. In particular, the drive arrangement 50 rotates the cylinder 36 in a counterclockwise direction as shown in FIG. 3 by the arrow 52, and moves the ball and socket point contact device 38 axially along the cylinder 36, for example, by rotation of a screw thread 54, upon which the ball and socket point contact device 38 is supported.

The drive arrangement 50 synchronizes the axial movement of the ball and socket point contact device 38 with the rotation of the cylinder 36 such that the point rupturing force exerted by the ball and socket point contact device 38 is scrolled along the cylinder 36 to contact substantially the entire sheet of imaging material received and supported upon the cylinder 36. As shown in FIG. 3, a transfer imaging sheet 10 together with an associated receiver sheet 32 have been mounted upon the cylinder 36 by sheet securing means comprising clips 56, or preferably, by means of vacuum systems well known in the art.

As shown in FIG. 3, the imaging sheet 10 has been processed by rotating the cylinder 36 in the counterclockwise direction indicated by the arrow 52 and moving the ball and socket point contact device 38 to the left to apply a uniform rupturing force over a band of the imaging sheet 10 extending from a point 58 near one end of the imaging sheet 10 to a point 60 approximately one-tenth of the distance along the imaging sheet 10. This development is revealed by a turned back corner of the imaging sheet 10 and indicated by a band 62 of an image formed on the receiver sheet 32 as if the imaging sheet 10 had not been exposed, and hence, represents a completely darkened image.

It is noted that processing time for developing an imaging sheet in accordance with the embodiment of FIG. 3 of the present invention may be reduced by the provision of multiple point contact devices. To illustrate this point, two additional point contact devices 38 have been indicated in dotted lines and would trace out bands 64 and 66 during the same period of time that the band 62 is traced out by the solid line point contact device 38 shown in FIG. 3. It will be apparent that any reasonable number of point contact devices 38 may be provided to speed up the processing of an imaging sheet 10. It should also be apparent that the apparatus of FIG. 3 can be appropriately sized to accommodate a variety of imaging sheet sizes up to and including even the largest contemplated widths.

The small area of the point contact device permits relatively low loading on the device which, due to the small area, is translated into adequately high pressures to rupture the microcapsules 14 and develop the imaging sheets 10. The resilient biasing of the one or more point contact devices into the surface of the support means for an imaging sheet accommodates any surface irregularities and greatly enhances image uniformity.

The synchronization of the axial movement of the point contact device or devices 38 with the rotation of the cylinder 36 may be such as to just trace out the entire imaging sheet 10. Alternately, an overlap of the paths of each point contact device may be provided such that the load or pressure exerted by each point contact device may be further reduced. Such overlap may also enhance the continuity of the image density resulting from the processing of the imaging sheet 10.

Figure 4:
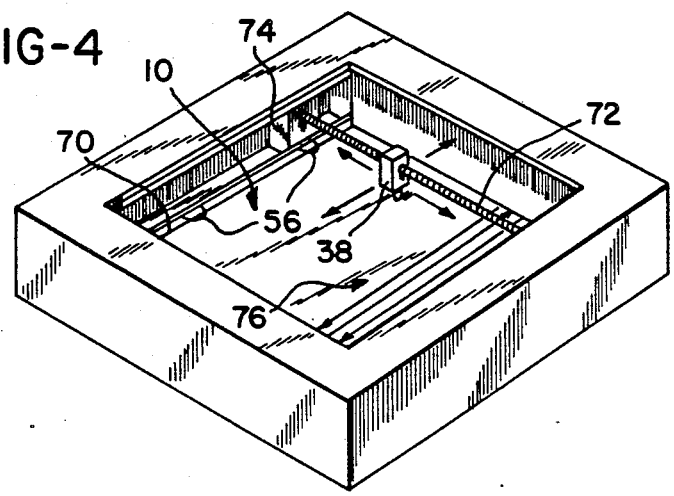

FIG. 4 is a schematic perspective view of a second illustrative embodiment of apparatus for processing imaging sheets in accordance with the present invention. In the embodiment of FIG. 4, support means comprises a substantially planar mounting platform 70 and the motive means for moving at least one point contact device 38 over the portion of the mounting platform 70 corresponding to substantially the entire surface of a sheet 10 of imaging material comprises an X-Y transport device schematically illustrated by a screw thread 72 and associated support apparatus 74 which is well known in the art of X-Y plotters and will not be described in detail herein.

In accordance with the embodiment of FIG. 4, a uniform rupturing force may be applied by the point contact device 38 to the imaging sheet 10 by means of traversing movements of the point contact device 38 as suggested by the arrows 76 in FIG. 4, or by other appropriate patterns such that the entire imaging sheet is traversed by the point contact device. It should be apparent in view of available X-Y plotters that the embodiment of FIG. 4 can be used to accommodate a large variety of imagining sheet sizes including the largest imaging sheets which may be required.

Figure 5:
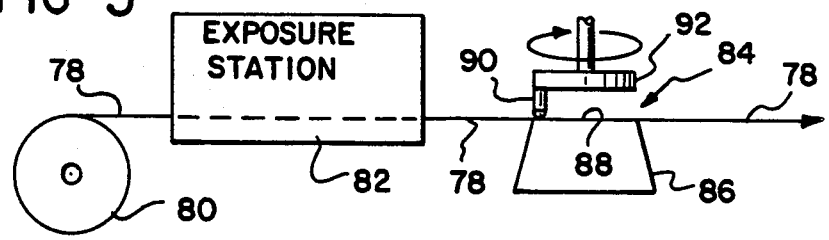

FIG. 5 is a schematic view of another illustrative embodiment of apparatus for processing imaging sheets 10 in accordance with the present invention, and in particular, for processing a continuous web of imaging material. As illustrated in FIG. 5, a continuous web 78 of imaging material is shown as extending from a source roll 80. The web 78 is drawn or scrolled through an exposure station 82 where a latent image is impressed upon the web of imaging material, for example, as illustrated in FIGS. 1B and 2B. After a latent image has been impressed upon the web 78 of imaging material at the exposure station 82, the web 78 is scrolled past a processing station 84. The processing station 84 includes a web support platform 86 which has a generally planar upper surface 88 having a width at least slightly exceeding the widest web of material to be processed.

Point contact means comprising a ball and socket point contact device 90 in FIG. 5 is positioned adjacent to and in resilient engagement with the upper surface 88 of the support platform 86 of the processing station 84. Point contact transport means 92 provides for moving the point contact device 90 over the platform 86 of the processing station 84 concurrently with the scrolling of the web 78 of imaging material to apply a uniform rupturing force over substantially the entire surface of the web 78 of imaging material as it is scrolled past the processing station 84 thereby rupturing the microcapsules on the web 78 of imaging material.

Figure 6:
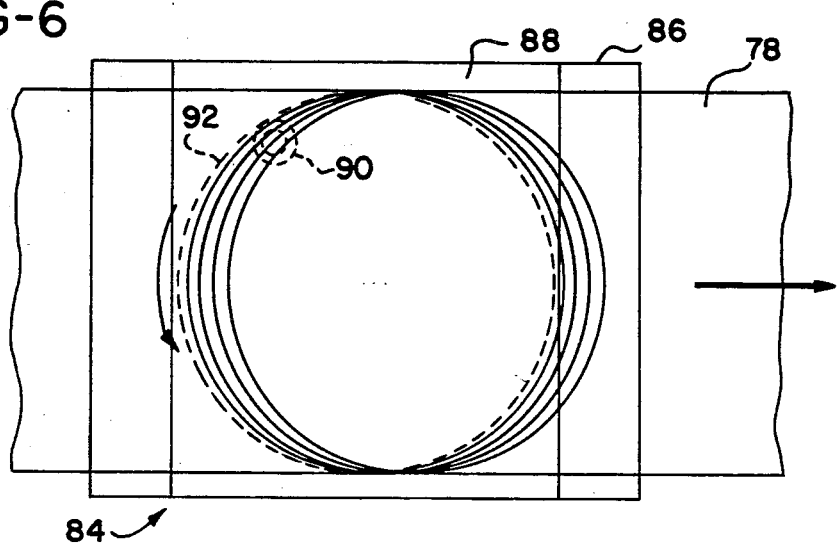

As best illustrated in FIG. 6, the point contact transport means 92 in the illustrative embodiment of FIG. 5 moves the point contact device 90 in a sweeping, substantially circular path. Of course, the point contact device 90 can be moved in a variety of patterns to process the web 78 of imaging material in accordance with the present invention.

The rotating ball point contact device 38, an ilustrative embodiment of which is shown in FIG. 7, is presently the preferred point contact device due to the apparent wear advantages produced by the rotation of the ball 40 in the device, as well as reduced frictional engagement of the point contact device with an imaging sheet being processed. The size of the ball 40 is not critical, and a working embodiment of the present invention has employed a ball which is approximately ¼ inch in diameter. It is noted that the width of the line of pressure applied by the rotating ball 40 is proportional to the cube root of the radius of the ball such that there is no particular advantage to increasing the ball size much beyond the ¼ inch diameter of the working embodiment. It is noted that if the ball size becomes too small, the point contact will tend to tear the imaging sheet, and hence, will not be appropriate for use in the invention of the present application.

While the rotating ball point contact device 38 is presently preferred for use in the present invention, a variety of point contact devices will be apparent in view of the foregoing description. For example, plastic or steel teeth could be formed in a comb comprising one or multiple teeth which are biased into an imaging sheet to provide one or more point contacts by means of the teeth or fibers. The use of such point contacts is referred to as fiber development and two illustrative embodiments of possible fiber combs are shown in FIGS. 8 and 9. In FIG. 8, a comb 100 comprises a metal base block 102 into which is inserted four plastic fiber teeth 104 each of which has a rounded metal tip 106 formed, for example, from stainless steel. A plurality of the combs 100 can be positioned across an imaging sheet 10 to be developed and biased into the imaging sheet to apply point contact pressure via each of the metal caps 106 as best shown in FIG. 8C.

Another comb design utilizing metallic fibers is shown in FIG. 9. The comb 108 comprises a metal base block 110 into which are secured four fibers 112 formed, for example, from piano wire, and bent into a "J" shape. A plurality of the combs 108 may be distributed across an imaging sheet 10 to be processed in accordance with the present invention and biased into the imaging sheet such that the outer rounded portion of the J-shaped fibers 112 are forced into contact with the imaging sheet 10 as best shown in FIG. 9C.

An additional embodiment of a point contact device is shown in FIG. 10 wherein a comb 120 includes four rolling wheels 122. The comb 120 comprises a metal base block 124 which supports a point contact roller frame 126 which is resiliently biased by springs 128 to extend from the base block 122. A plurality of combs 120 can be positioned across an imaging sheet 10 to be developed and biased into the imaging sheet to apply point contact pressure via each of the wheels 122 as best shown in FIG. 10C. It is noted that a large variety of arrangements are possible for mounting a rolling wheel, either singly or multiply in a comb as shown, to form point contact devices which may be used in the invention of the present application.

It is apparent that a method and inexpensive apparatus have been disclosed for processing imaging sheets by means of at least one point contact which is resiliently biased into engagement with the imaging sheets such that the force of the point contact is applied to substantially the entire imaging area of the imaging sheet by means of relative motion therebetween to rupture the microcapsules in the presence of a developer to thereby permit chromogenic material coating the sheets to interact with a developer and thereby develop latent images on the imaging sheets. While a variety of embodiments have been disclosed for performing point contact development, many other arrangements will be apparent to those skilled in the art after a review of the above disclosure.

While the methods herein described and the forms of apparatus for carrying these methods into effect constitute preferred embodiments of this invention, it is to be understood that the invention is not limited to these precise methods and forms of apparatus, and that changes may be made in either without departing from the scope of the invention which is defined in the appended claims.

What is claimed is:

1. Apparatus for rupturing photosensitive microcapsules which form a photosensitive layer on the surface of imaging material comprising:
   support means for receiving said imaging material;
   point contact means positioned adjacent to said support means for defining at least one point contact, said point contact means being resiliently biased into continuous engagement with said support means to apply at least one point of uniform rupturing force to imaging material secured to said support means;

motive means for causing relative movement between said support means and said point contact means whereby a uniform rupturing force is applied to substantially the entire imaging area of said imaging material thereby rupturing said microcapsules within said imaging area.

2. Apparatus for rupturing photosensitive microcapsules as claimed in claim 1 wherein said support means comprises a cylinder mounted for rotation, said point contact means is mounted for axial movement along said cylinder and said motive means comprises drive means for rotating said cylinder and for axially moving said point contact means along said cylinder in synchronism with the rotation of said cylinder.

3. Apparatus for rupturing photosensitive microcapsules as claimed in claim 2 wherein said point contact means comprises a ball mounted for rotation in an appropriate receiving socket whereby point contact is made by said ball as it rotates within said socket and over said imaging material.

4. Apparatus for rupturing photosensitive microcapsules as claimed in claim 2 wherein said support means comprises a substantially planar mounting platform, and said motive means moves said point contact means over the portion of said mounting platform corresponding to said imaging area of said imaging material.

5. Apparatus for rupturing photosensitive microcapsules as claimed in claim 4 wherein said point contact means comprises a ball mounted for rotation in an appropriate receiving socket whereby point contact is made by said ball as it rotates within said socket and over said imaging material.

6. Apparatus for rupturing photosensitive microcapsules which form a photosensitive layer on the surface of a web of imaging material comprising:

web transport means for scrolling a web of imaging material past a processing station;

point contact means positioned adjacent to and in resilient continuous engagement with said web transport means at said processing station for applying at least one point of uniform rupturing force to a web of imaging material; and point contact transport means for moving said point contact means over said web transport means concurrently with the scrolling of a web of imaging material to apply a uniform rupturing force to substantially the entire imaging area of a web of imaging material as it is scrolled past said processing station thereby rupturing said microcapsules.

7. Apparatus for rupturing photosensitive microcapsules as claimed in claim 6 wherein said point contact transport means moves said point contact means in a sweeping, substantially circular path.

8. Apparatus for rupturing photosensitive microcapsules as claimed in claim 7 wherein said point contact means comprises a ball mounted for rotation in an appropriate receiving socket whereby point contact is made by said ball as it rotates within said socket and over said imaging material.

* * * * *